United States Patent
Emura

(10) Patent No.: US 12,001,046 B2
(45) Date of Patent: Jun. 4, 2024

(54) LIGHT-EMITTING DEVICE

(71) Applicant: NICHIA CORPORATION, Anan (JP)

(72) Inventor: Keiji Emura, Anan (JP)

(73) Assignee: NICHIA CORPORATION, Anan (JP)

( * ) Notice: Subject to any disclaimer, the term of this patent is extended or adjusted under 35 U.S.C. 154(b) by 7 days.

(21) Appl. No.: 17/449,446

(22) Filed: Sep. 29, 2021

(65) Prior Publication Data

US 2022/0099879 A1   Mar. 31, 2022

(30) Foreign Application Priority Data

Sep. 30, 2020   (JP) ................................. 2020-165090

(51) Int. Cl.
*F21V 8/00*   (2006.01)

(52) U.S. Cl.
CPC ......... *G02B 6/0051* (2013.01); *G02B 6/0003* (2013.01); *G02B 6/0055* (2013.01)

(58) Field of Classification Search
CPC .. G02B 6/0051; G02B 6/0003; G02B 6/0055; G02F 1/133606
See application file for complete search history.

(56) References Cited

U.S. PATENT DOCUMENTS

| | | | | |
|---|---|---|---|---|
| 2008/0266896 A1* | 10/2008 | Chang | .................. | G02B 6/0036 362/606 |
| 2009/0021958 A1* | 1/2009 | Chang | .................. | G02B 5/0268 362/607 |
| 2011/0261290 A1* | 10/2011 | Kim | .................. | G02F 1/133611 349/64 |
| 2014/0070249 A1 | 3/2014 | Yoon et al. | | |
| 2015/0155450 A1 | 6/2015 | Oka et al. | | |
| 2017/0092825 A1 | 3/2017 | Bando | | |
| 2018/0182940 A1 | 6/2018 | Yamamoto et al. | | |
| 2019/0187514 A1 | 6/2019 | Kuniyasu et al. | | |
| 2019/0212613 A1* | 7/2019 | Yasunaga | .......... | G02F 1/133609 |
| 2019/0227221 A1 | 7/2019 | Yasunaga et al. | | |
| 2020/0072442 A1 | 3/2020 | Wu et al. | | |
| 2020/0257035 A1 | 8/2020 | Kuksenkov et al. | | |

FOREIGN PATENT DOCUMENTS

| | | |
|---|---|---|
| JP | 2004014365 A | 1/2004 |
| JP | 2012064476 A | 3/2012 |
| JP | 2014057062 A | 3/2014 |
| JP | 2015106641 A | 6/2015 |
| JP | 2016127052 A | 7/2016 |
| JP | 201769368 A | 4/2017 |
| JP | 2018010041 A | 1/2018 |

(Continued)

*Primary Examiner* — Abdulmajeed Aziz
*Assistant Examiner* — Jessica M Apenteng
(74) *Attorney, Agent, or Firm* — Hunton Andrews Kurth LLP

(57) ABSTRACT

A light-emitting device includes a light-emitting element, a light guide member surrounding the light-emitting element, a diffuser plate located on the light-emitting element and on the light guide member, and a metal pattern located at an upper surface of the diffuser plate. The diffuser plate contacts the light-emitting element and diffuses light emitted from the light-emitting element. A proportion of a region of the upper surface of the diffuser plate where the metal pattern is not located increases as a distance from the light-emitting element increases.

20 Claims, 9 Drawing Sheets

(56) References Cited

FOREIGN PATENT DOCUMENTS

| | | | |
|---|---|---|---|
| JP | 2018107257 A | 7/2018 | |
| JP | 2019129066 A | 8/2019 | |
| JP | 2019201089 A | 11/2019 | |
| JP | 2020035738 A | 3/2020 | |
| JP | 2020113799 A | 7/2020 | |
| JP | 2020532832 A | 11/2020 | |
| WO | WO-2011025100 A1 * | 3/2011 | ........... G02B 6/0021 |

* cited by examiner

LIGHT-EMITTING DEVICE

CROSS-REFERENCE TO RELATED APPLICATIONS

This application is based upon and claims the benefit of priority from the prior Japanese Patent Application No. 2020-165090, filed on Sep. 30, 2020; the entire contents of which are incorporated herein by reference.

FIELD

Embodiments relate to a light-emitting device.

BACKGROUND

Light sources of display devices and the like include planar light-emitting devices that use light-emitting diodes (LEDs) (See Japanese Patent Publication No. 2012-064476 and No. 2018-010041). As display devices and the like are thinned, it is also desirable to thin the light-emitting devices. However, it is difficult to reduce uneven luminance when a light-emitting device is thinned.

SUMMARY

According to an aspect of the present invention, a light-emitting device includes a light-emitting element, a light guide member surrounding the light-emitting element, a diffuser plate located on the light-emitting element and on the light guide member, and a metal pattern located at an upper surface of the diffuser plate. The diffuser plate contacts the light-emitting element and diffuses light emitted from the light-emitting element. A proportion of a region of the upper surface of the diffuser plate where the metal pattern is not located increases as a distance from the light-emitting element increases.

DETAILED DESCRIPTION OF EXEMPLARY EMBODIMENTS

First Embodiment

Figure 1A:
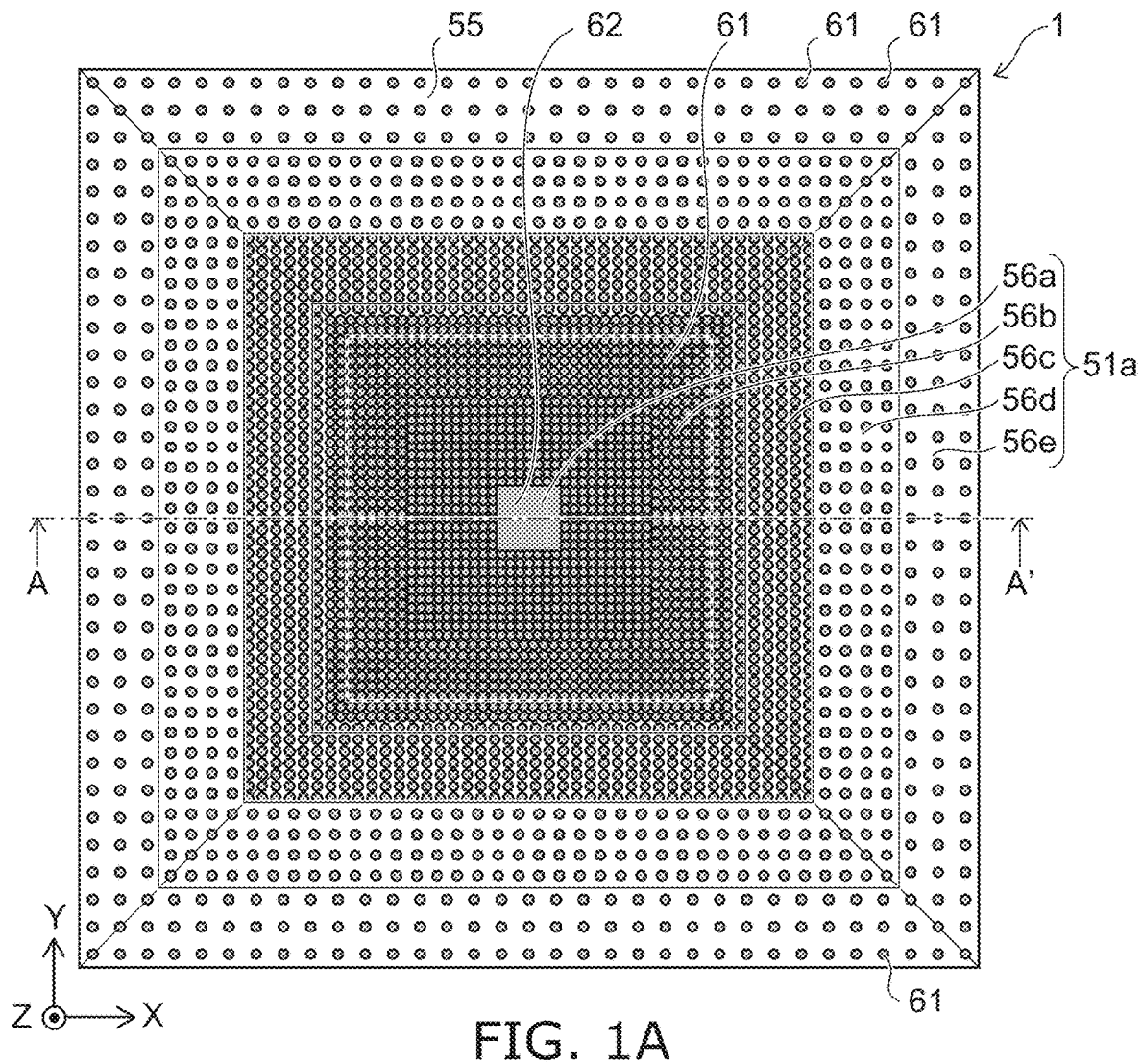
FIG. 1A is a top view showing an exemplary light-emitting device according to a first embodiment of the present disclosure.
Figure 1B:
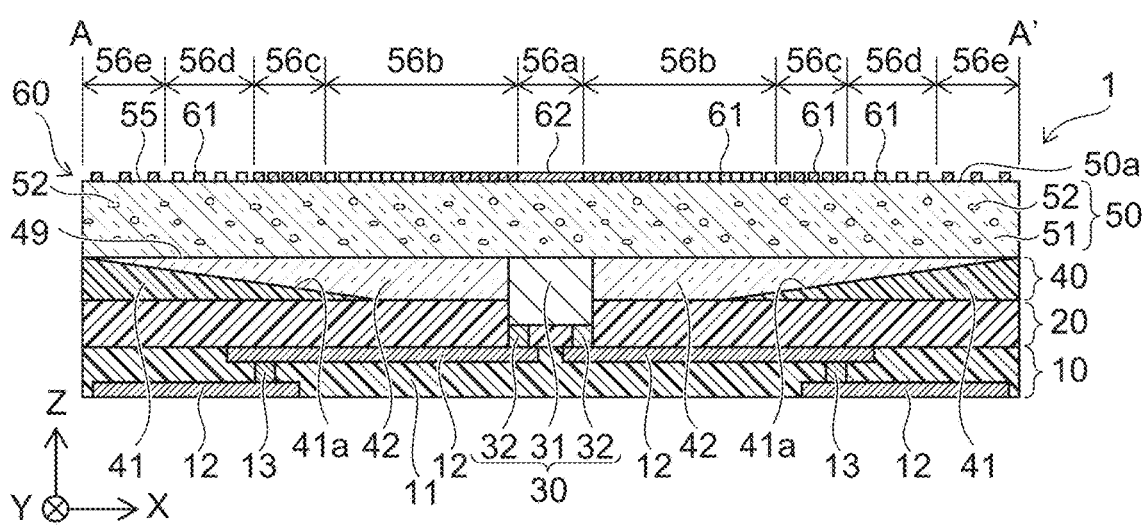
FIG. 1B is an end view along line A-A' shown in FIG. 1A.

As shown in FIGS. 1A and 1B, a light-emitting device 1 according to the embodiment may include a wiring substrate 10, a reflective layer 20, a light-emitting element 30, a light guide member 40, a diffuser plate 50, and a metal pattern 60. The light guide member 40 may surround the light-emitting element 30. The diffuser plate 50 may be located on the light-emitting element 30 and on the light guide member 40, may contact the light-emitting element 30, and may diffuse light emitted from the light-emitting element 30. The metal pattern 60 may be located at an upper surface 50a of the diffuser plate 50. The wiring substrate 10 and the reflective layer 20 may not be provided. The wiring substrate 10 and the reflective layer 20 may be provided in an example according to the embodiment.

An XYZ orthogonal coordinate system is employed for convenience of description in the specification. Mutually-orthogonal directions parallel to the upper surface 50a of the diffuser plate 50 are taken as an "X-direction" and a "Y-direction"; and a direction perpendicular to the upper surface 50a of the diffuser plate 50 is taken as a "Z-direction". Among the Z-directions, a direction from the wiring substrate 10 toward the diffuser plate 50 also is called "up (or other terms including "up")", and the opposite direction also is called "down (or other terms including "down")"; however, these expressions are for convenience and are independent of the direction of gravity. In the specification, the expression "light-reflecting" means that the reflectance of the incident light is greater than the transmittance; and the expression "light-transmitting" means that the transmittance of the incident light is greater than the reflectance. The drawings described below are schematic, and are simplified and exaggerated as appropriate for easier viewing of the drawing.

For example, the wiring substrate 10 has a rectangular plate shape. The thickness direction of the wiring substrate 10 is the Z-direction; and the edges of the wiring substrate 10 extend in the X-direction and the Y-direction. The wiring substrate 10 includes an insulating layer 11; and wiring 12 and a via 13 are provided inside the insulating layer 11.

The reflective layer 20 is located on the wiring substrate 10. For example, the reflective layer 20 is formed of a white resin material or a reflective film. The reflective layer 20 reflects the light emitted from the light-emitting element 30. A white resin material is a resin that includes a light-reflective white substance.

The light-emitting element 30 is mounted to the wiring substrate 10. The light-emitting element 30 is, for example, a light-emitting diode (LED). The light-emitting element 30 includes a semiconductor part 31 and a pair of electrodes 32. The pair of electrodes 32 is located at the lower surface of the semiconductor part 31. The lower portion of the semiconductor part 31 is located inside the reflective layer 20. The portion of the semiconductor part 31 other than the lower portion protrudes from the upper surface of the reflective layer 20. The pair of electrodes 32 extends through the reflective layer 20 in the downward direction and is connected to mutually-different wiring 12 of the wiring substrate 10.

As an entirety, the light guide member 40 has a plate shape. According to the embodiment, the light guide member 40 includes a reflecting portion 41 and a light-transmitting portion 42. The reflecting portion 41 is formed of, for example, a white resin material and reflects the light emitted from the light-emitting element 30. For example, the reflecting portion 41 is located away from the light-emitting element 30. An upper surface 41a of the reflecting portion 41 is inclined toward the diffuser plate 50 as a distance from the light-emitting element 30 increases. The upper surface 41a may be four flat surfaces that are inclined with respect to the XY plane. For example, the upper surface 41a of the reflecting portion 41 may include the lateral surfaces of an inverted truncated rectangular pyramid. Alternatively, the upper surface 41a may be curved to be concave or convex. The light-transmitting portion 42 is formed of, for example, a transmissive resin material that transmits the light emitted from the light-emitting element 30. The light-transmitting portion 42 is located on the reflecting portion 41 and may contact the lateral surface of the light-emitting element 30.

The material of the light guide member 40 can include, for example, a thermoplastic resin such as an acrylic resin, a polycarbonate resin, a cyclic polyolefin resin, a polyethylene terephthalate resin, a polyester resin, or the like, a thermosetting resin such as an epoxy resin, a silicone resin, or the like, glass, etc. The white resin material that is included in the reflective layer 20 and/or the reflecting portion 41 is a resin that includes a light-reflective white substance. For example, a resin material that includes a thermosetting resin such as a silicone resin, a silicone-modified resin, an epoxy resin, a phenol resin, or the like as a major component is an example of the resin material. For example, titanium oxide, silicon oxide, zirconium oxide, potassium titanate, aluminum oxide, aluminum nitride, boron nitride, mullite, etc., are examples of the light-reflective white substance.

As described above, the diffuser plate 50 may be located on the light-emitting element 30 and on the light guide member 40 and may contact the light-emitting element 30. For example, the upper surface of the light-emitting element 30 may contact the lower surface of the diffuser plate 50. The diffuser plate 50 may transmit and diffuse the light emitted from the light-emitting element 30.

The diffuser plate 50 may include a base material 51 that is formed of a light-transmitting material. A phosphor 52 may be included in the base material 51. The phosphor 52 absorbs a portion of the light emitted from the light-emitting element 30 and irradiates light of a different wavelength from the absorbed light. However, the configuration of the diffuser plate 50 is not limited to this configuration. For example, the diffuser plate 50 may include a portion that includes the phosphor 52 and a portion that substantially does not include the phosphor 52. The diffuser plate 50 may not include the phosphor 52. The diffuser plate 50 may include an adhesive layer for bonding the light-emitting element 30 and the light guide member 40 to the diffuser plate 50. The diffuser plate 50 may include a light-diffusing material that diffuses the light. For example, titanium oxide is an example of the material of the light-diffusing material. Material examples of the phosphor 52 are described below.

The metal pattern 60 is located at the upper surface 50a of the diffuser plate 50. The metal pattern 60 is formed of a metal. Here, "metal pattern" refers to the metal(s) that is located at the upper surface 50a of the diffuser plate 50 as a whole, and includes a pattern at some surface including regions at which the metal exists and regions at which the metal does not exist. The metal pattern may be multiple metal parts that are separated from each other, or may be one metal part that includes multiple mutually-separated regions at which the metal part does not exist, or may be a combination of such configurations.

The metal pattern 60 has at least the function of reflecting the light propagating through the diffuser plate 50 so that the light is spread over the interior of the diffuser plate 50 to reduce uneven luminance, and the function of dissipating heat from the diffuser plate 50. For example, aluminum, copper, silver, a silver alloy, etc., are examples of the material of the metal pattern 60. It is preferable to use a metal that has high light reflectance to efficiently reflect the light that reaches the metal pattern 60; aluminum, silver, a silver alloy, etc., are examples of such a metal. It is preferable to use a metal that has a high thermal conductivity to efficiently perform thermal diffusion via the metal pattern 60 at the upper surface 50a of the diffuser plate 50; copper, silver, a silver alloy, etc., are examples of such a metal. Also, the metal pattern 60 can be an aluminum/copper stacked body or an aluminum/copper/aluminum stacked body to efficiently reflect the light that reaches the metal pattern 60 and to efficiently perform thermal diffusion at the upper surface 50a of the diffuser plate 50. The metal pattern 60 includes, for example, many first metal portions 61 and one second metal portion 62. The thickness, i.e., the length in the Z-direction, of the metal pattern 60 can be 0.5 µm to 50 µm, and preferably 1 µm to 15 µm.

Figure 2A:
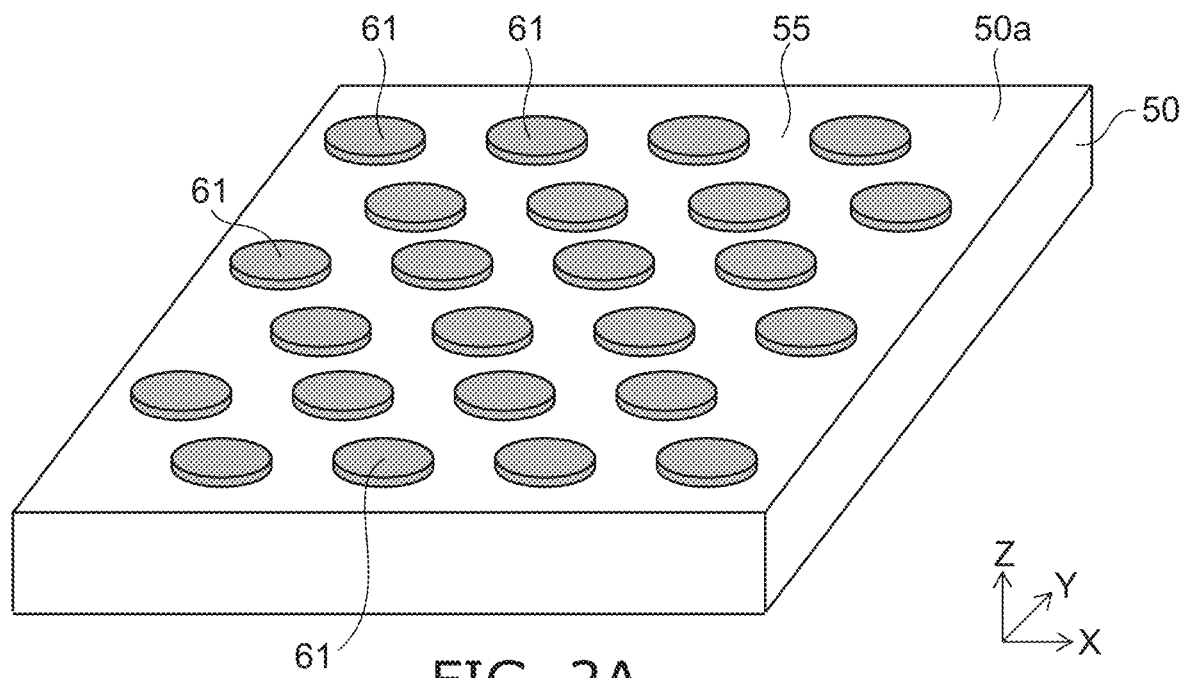
FIG. 2A is a perspective view showing an exemplary first metal portion according to the first embodiment of the present disclosure.
Figure 2B:
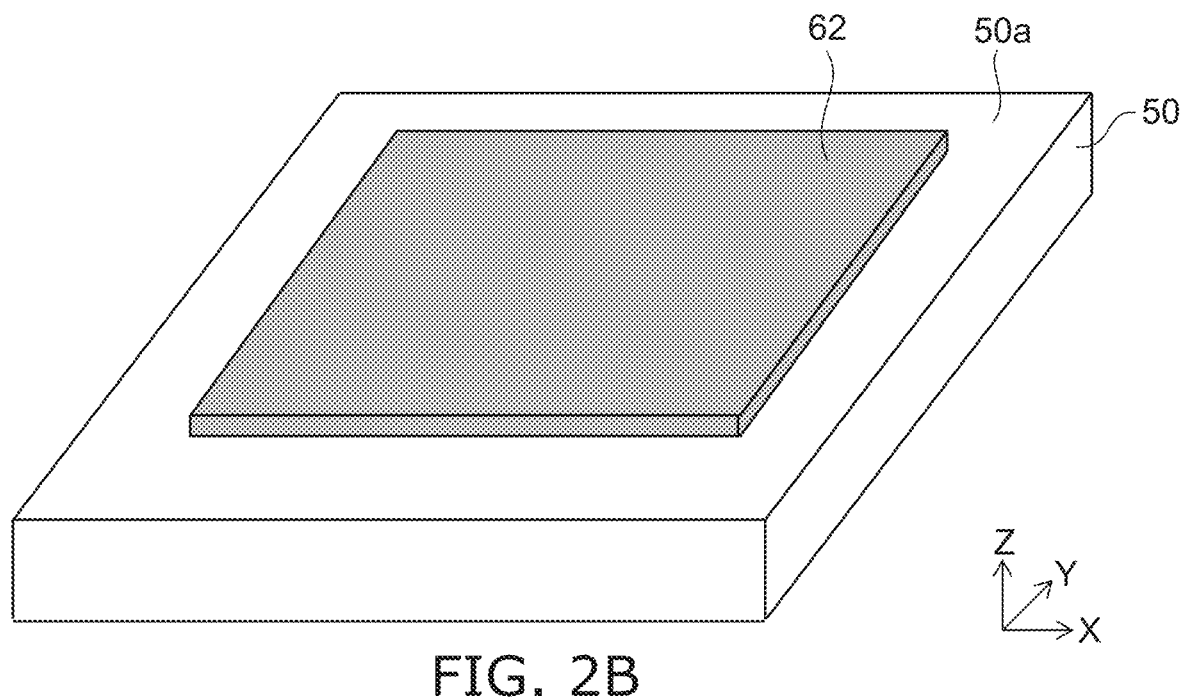
FIG. 2B is a perspective view showing an exemplary second metal portion according to the first embodiment of the present disclosure.

As shown in FIG. 2A, for example, the first metal portion 61 has a discal shape. As shown in FIG. 2B, for example, the second metal portion 62 has a rectangular plate shape. The diameter of the first metal portion 61 is, for example, less than the length of one side of the second metal portion 62.

As shown in FIGS. 1A and 1B, for example, the second metal portion 62 is located in a region of the upper surface 50a of the diffuser plate 50 that is directly above the light-emitting element 30. The second metal portion 62 may be located in a portion of the region directly above the light-emitting element 30 or may be located in a region that includes the region directly above the light-emitting element 30. The multiple first metal portions 61 are located in a region of the upper surface 50a of the diffuser plate 50 where the second metal portion 62 is not provided.

The arrangement density of the first metal portions 61 is denser proximate to the light-emitting element 30. Therefore, the proportion of a region 55 of the upper surface 50a of the diffuser plate 50 where the metal pattern 60 is not provided increases as the distance from the light-emitting element 30 increases. The light that reaches the upper surface 50a from the interior of the diffuser plate 50 and reaches the metal pattern 60 is reflected toward the interior of the diffuser plate 50 by the metal pattern 60. At least a portion of the light that reaches the region 55 is emitted out of the diffuser plate 50.

The upper surface 50*a* of the diffuser plate 50 is divided into multiple regions. Although an example is described hereinbelow in which the upper surface 50*a* is divided into five regions, the upper surface 50*a* is not limited to this example. For example, the upper surface 50*a* includes a first region 56*a*, a second region 56*b*, a third region 56*c*, a fourth region 56*d*, and a fifth region 56*e*.

The first region 56*a* is a region of the upper surface 50*a* directly above the light-emitting element 30. The second region 56*b* surrounds the first region 56*a*. The third region 56*c* surrounds the second region 56*b*. The fourth region 56*d* surrounds the third region 56*c*. The fifth region 56*e* surrounds the fourth region 56*d*.

In a top view, the first region 56*a* has the same shape as the light-emitting element 30 and is, for example, rectangular. In the top view, for example, the second region 56*b*, the third region 56*c*, the fourth region 56*d*, and the fifth region 56*e* have rectangular frame shapes. In the top view, the inner edge of the reflecting portion 41 of the light guide member 40 is positioned inside the second region 56*b*. Also, the outer edge of the fifth region 56*e* is the outer edge of the upper surface 50*a*. In other words, the fifth region 56*e* includes the edges of the diffuser plate 50.

In the first region 56*a*, the second metal portion 62 is provided over the entire first region 56*a*. In the second region 56*b*, the multiple first metal portions 61 contact each other. The first metal portions 61 that are located at the innermost perimeter portion of the second region 56*b* contact the second metal portion 62 that is located in the first region 56*a*. In FIG. 2B, the first metal portions 61 that contact the second metal portion 62 are not illustrated. The multiple first metal portions 61 are separated from each other in the third to fifth regions 56*c* to 56*e*. However, the arrangement density of the first metal portions 61 in the fourth region 56*d* is less than the arrangement density of the first metal portions 61 in the third region 56*c*; and the arrangement density of the first metal portions 61 in the fifth region 56*e* is less than the arrangement density of the first metal portions 61 in the fourth region 56*d*.

Therefore, a proportion r1 of the region 55 where the metal pattern 60 is not provided in the first region 56*a* is less than a proportion r2 of the region 55 in the second region 56*b*. The proportion r2 of the region 55 in the second region 56*b* is less than a proportion r3 of the region 55 in the third region 56*c*. The proportion r3 of the region 55 in the third region 56*c* is less than a proportion r4 of the region 55 in the fourth region 56*d*. The proportion r4 of the region 55 in the fourth region 56*d* is less than a proportion r5 of the region 55 in the fifth region 56*e*. In other words, the relationship of r1 to r5 is r1<r2<r3<r4<r5.

Because the second metal portion 62 is located over the entire first region 56*a*, the proportion r1 of the region 55 in the first region 56*a* is, for example, 0%. The proportion r5 of the region 55 in the fifth region 56*e* is, for example, not less than 90%, and may be 100%, that is, the metal pattern 60 may not be provided.

For example, the method for forming the metal pattern 60 can be selected from the group consisting of a printing method such as screen printing, inkjet printing, or the like that uses a paste including metallic fine particles, a physical processing such as punching (stamping), dicing, blast removal, laser patterning, or the like, etching, a damascene process, and lift-off, and combinations thereof. From the perspective of cost, printing is superior; but from the perspective of patterning precision, a semiconductor process is preferable. For example, recesses may be formed in the upper surface of a light transmissive resin sheet; subsequently, a metal film may be formed over the entire upper surface of the light transmissive resin sheet; and the metal film may be selectively removed by polishing the upper surface so that the metal film remains only inside the recesses. Then, the metal pattern 60 may be formed at the upper surface 50*a* by transferring the metal film that remains inside the recesses onto the upper surface 50*a* of the diffuser plate 50.

As examples of the thickness, i.e., the length in the Z-direction of the components, the thickness of the wiring substrate 10 is about 100 μm; the thickness of the reflective layer 20 is about 65 μm; the thickness of the light guide member 40 is about 100 μm; and the thickness of the diffuser plate 50 is about 100 μm.

Examples of the configurations and materials of the components will now be described.

As described above, the light-emitting element 30 includes the semiconductor part 31 and the pair of electrodes 32. The light-emitting element 30 may further include a light-transmitting substrate formed of sapphire, etc. When the semiconductor part 31 is configured to emit ultraviolet light or visible light from blue light to green light, the semiconductor part 31 can include, for example, a Group III-V compound semiconductor, specifically, a nitride semiconductor such as $In_xAl_yGa_{1-X-Y}N$ ($0 \leq X$, $0 \leq Y$, and $X+Y \leq 1$), etc. When the semiconductor part 31 is configured to emit red visible light, the semiconductor part 31 can include a semiconductor such as GaAs, GaAlAs, GaP, InGaAs, InGaAsP, etc. The thickness of the semiconductor part 31 can be, for example, 3 μm to 500 μm.

The semiconductor part 31 can include at least one light-emitting layer that is configured to emit a light emission color such as ultraviolet light, blue light, green light, red light, etc., such as those described above. For example, the semiconductor part can be a semiconductor stacked body that includes a light-emitting layer that is configured to emit one light emission color and is located between a first-conductivity-type semiconductor layer (e.g., an n-type semiconductor layer) and a second-conductivity-type semiconductor layer (e.g., a p-type semiconductor layer). The light-emitting layer may have a structure that includes a single active layer such as a double heterojunction, a single quantum well structure (SQW), or the like, or may have a structure that includes an active layer group such as a multi-quantum well structure (MQW).

The semiconductor part 31 can include multiple light-emitting layers. For example, the semiconductor part may have a structure that includes multiple light-emitting layers between an n-type semiconductor layer and a p-type semiconductor layer, or may have a successively repeated structure of an n-type semiconductor layer, a light-emitting layer, and a p-type semiconductor layer multiple times in this sequence. The multiple light-emitting layers may include active layers that have different light emission colors or active layers that have the same light emission color. The same light emission color may include variation within a range that can be considered to be the same light emission color in use, e.g., about several nm at the dominant wavelength. A combination of the light emission colors can be selected as appropriate. For example, when the semiconductor part includes two active layers, examples of combinations of the light emission colors include blue light and blue light, green light and green light, red light and red light, ultraviolet light and ultraviolet light, blue light and green light, blue light and red light, green light and red light, etc.

The light-emitting element 30 may further include a layer that includes a phosphor and/or a layer that includes a light-diffusing agent, at the surface at the side opposite to the pair of electrodes 32, lateral surface(s) linked to the surface at the side opposite to the pair of electrodes 32, etc.

The pair of electrodes 32 can be formed of materials and configurations known in relevant fields and can have any thickness. For example, the electrode 32 can be formed of a single-layer film formed of at least one type of metal selected from the group consisting of gold (Au), platinum (Pt), palladium (Pd), rhodium (Rh), nickel (Ni), tungsten (W), molybdenum (Mo), chrome (Cr), titanium (Ti), aluminum (Al), copper (Cu), tin (Sn), iron (Fe), and silver (Ag) or formed of an alloy of the at least one type of metal, or can be formed of a stacked film in which these single-layer films are stacked. Specifically, the electrode 32 can be formed of a stacked film such as (Ti/Rh/Au), (Ti/Pt/Au), (W/Pt/Au), (Rh/Pt/Au), (Ni/Pt/Au), (Al—Cu alloy/Ti/Pt/Au), (Al—Si—Cu alloy/Ti/Pt/Au), (Ti/Rh), etc., from the semiconductor part 31 side.

The phosphor 52 may include any phosphor known in relevant fields. For example, examples of a phosphor that is excitable by an element emitting blue light or an ultraviolet light-emitting element are an yttrium-aluminum-garnet-based phosphor activated with cerium (YAG:Ce), a lutetium-aluminum-garnet-based phosphor activated with cerium (LAG:Ce), a nitrogen-including calcium aluminosilicate-based phosphor ($CaO$—$Al_2O_3$—$SiO_2$) activated with europium and/or chrome, silicate-based phosphor (($Sr, Ba)_2SiO_4$) activated with europium, a nitride-based phosphor such as a β-sialon phosphor, a CASN-based phosphor, a SCASN-based phosphor, or the like, a KSF-based phosphor ($K_2SiF_6$:Mn), a sulfide-based phosphor, a quantum dot phosphor, etc. Light-emitting devices of various colors (e.g., a white light-emitting device) can be manufactured by combining such phosphors with an element emitting blue light or an ultraviolet light-emitting element. One or a plurality of these phosphors can be used. In the case of a plurality, a single layer that includes a mixture of plurality of such phosphors may be used, or layers that each include at least one phosphor can be stacked. The wavelength conversion member may include various fillers or the like to adjust the viscosity, etc.

Examples of a quantum dot phosphor include at least one selected from the group consisting of a Group II-VI compound, a Group III-V compound, a Group IV-VI compound, and a Group IV compound. From the perspective of the luminous efficiency, it is preferable for the quantum dot phosphor to include a compound including at least one of Cd and In.

Specific examples of the Group II-VI compound include CdSe, CdTe, CdS, ZnS, ZnSe, ZnTe, ZnO, HgS, HgSe, HgTe, etc. Specific examples of the Group III-V compound include GaN, GaP, GaAs, GaSb, AlN, AlP, AlAs, AlSb, InN, InP, InAs, InSb, etc. Specific examples of the Group IV-VI compound include SnS, SnSe, SnTe, PbS, PbSe, PnTe, etc. Specific examples of the Group IV compound include Si, Ge, SiC, SiGe, etc.

It is preferable for the quantum dot phosphor to have a core/shell structure. The quantum yield of the quantum dot phosphor can be further improved by setting the bandgap of the compound constituting the shell to be wider than the bandgap of the compound constituting the core. Examples of the combination of the core and the shell (core/shell) are CdSe/ZnS, InP/ZnS, PbSe/PbS, CdSe/CdS, CdTe/CdS, CdTe/ZnS, etc.

Operations of the light-emitting device 1 according to the embodiment will now be described.

The semiconductor part 31 of the light-emitting element 30 emits light when electrical power is supplied to the light-emitting element 30 via the wiring substrate 10. For example, the light-emitting element 30 emits blue light. A portion of the light that is emitted from the light-emitting element 30 passes through the light-transmitting portion 42 of the light guide member 40 and is incident on the diffuser plate 50. Before being incident on the diffuser plate 50, the light that is emitted from the light-emitting element 30 may be reflected by the upper surface of the reflective layer 20 or may be reflected by the upper surface 41a of the reflecting portion 41. Another portion of the light that is emitted from the light-emitting element 30 is incident on the diffuser plate 50 without passing through the light-transmitting portion 42. Inside the diffuser plate 50, the base material 51 transmits the light. The phosphor 52 absorbs the light and emits light of a different wavelength. For example, the phosphor 52 emits yellow light. Thereby, for example, white light is emitted from the diffuser plate 50.

Among portions of the light that reach the upper surface 50a from the interior of the diffuser plate 50, a portion of the light that reaches the metal pattern 60 is reflected by the metal pattern 60, returns to the interior of the diffuser plate 50, and is reflected by an interface 49 between the diffuser plate 50 and the light-transmitting portion 42, the upper surface 41a of the reflecting portion 41, or the upper surface of the reflective layer 20. Among portions of the light that reach the upper surface 50a of the diffuser plate 50, at least a portion of the light that reaches the region 55 where the metal pattern 60 is not provided is emitted out of the diffuser plate 50. That is, the upper surface 50a of the diffuser plate 50 where the metal pattern 60 is formed is a surface that emits the light from the light-emitting device 1. Thus, the light that is emitted from the light-emitting element 30 propagates and is diffused in the lateral direction (the XY-direction) while repeating reflections between the metal pattern 60 and the interface 49, the upper surface 41a, etc.

A portion of the heat that is generated in the light-emitting element 30 is conducted through the diffuser plate 50 and reaches the upper surface 50a. A portion of the heat that reaches the upper surface 50a is dissipated externally via the metal pattern 60.

Effects according to the embodiment will now be described.

The light-emitting element 30 contacts the diffuser plate 50 in the light-emitting device 1. The length in the Z-direction of the light-emitting device 1 can be reduced thereby. As a result, the light-emitting device 1 can be thinned.

In the light-emitting device 1, the proportion of the region 55 of the upper surface 50a of the diffuser plate 50 where the metal pattern 60 is not located increases away from the light-emitting element 30; therefore, the light is more easily emitted from the diffuser plate 50 away from the light-emitting element 30. The light in the region of the upper surface 50a of the diffuser plate 50 proximate to the light-emitting element 30 is less likely to be concentrated, and therefore uneven luminance of the light that is emitted from the upper surface 50a can be reduced. As a result, the light-emitting device 1 can have reduced uneven luminance and can be thinned.

In particular, the second metal portion 62 is located in the first region 56a of the upper surface 50a of the diffuser plate 50, and the proportion r1 of the region 55 where the metal pattern 60 is not located is 0%. Therefore, the emission of intense light directly above the light-emitting element 30 can be avoided, and uneven luminance can be further reduced.

In the light-emitting device 1, heat dissipation is good because the metal pattern 60 is located at the upper surface 50a of the diffuser plate 50. In particular, the region of the upper surface 50a where the metal pattern 60 is not provided decreases and the arrangement density of the metal pattern 60 increases closer to the light-emitting element 30, therefore, the heat dissipated from the light-emitting element 30 can be efficiently dissipated. This is particularly effective when the light-emitting element 30 is an element such as a light-emitting diode (LED) that emits a large amount of heat in a micro region due to the light emission.

The effect of heat dissipation via the metal pattern 60 is particularly large when the phosphor 52 that is included in the diffuser plate 50 is a quantum dot (QD) phosphor because quantum dot phosphors are not resistant to heat.

Because the metal pattern 60 is formed of a metal, compared to a resin material, the metal pattern 60 can be thinner while realizing a predetermined light-shielding ratio. By forming the metal pattern 60 of a metal, for example, compared to a light transmissive resin that includes a filler, the thickness can be not more than $\frac{1}{100}$, and even about $\frac{1}{1000}$.

Second Embodiment

In embodiments described below, differences with the first embodiment are mainly described, portions similar to the first embodiment are marked with the same reference numerals, and a description of such portions is simplified or omitted.

Figure 3A:
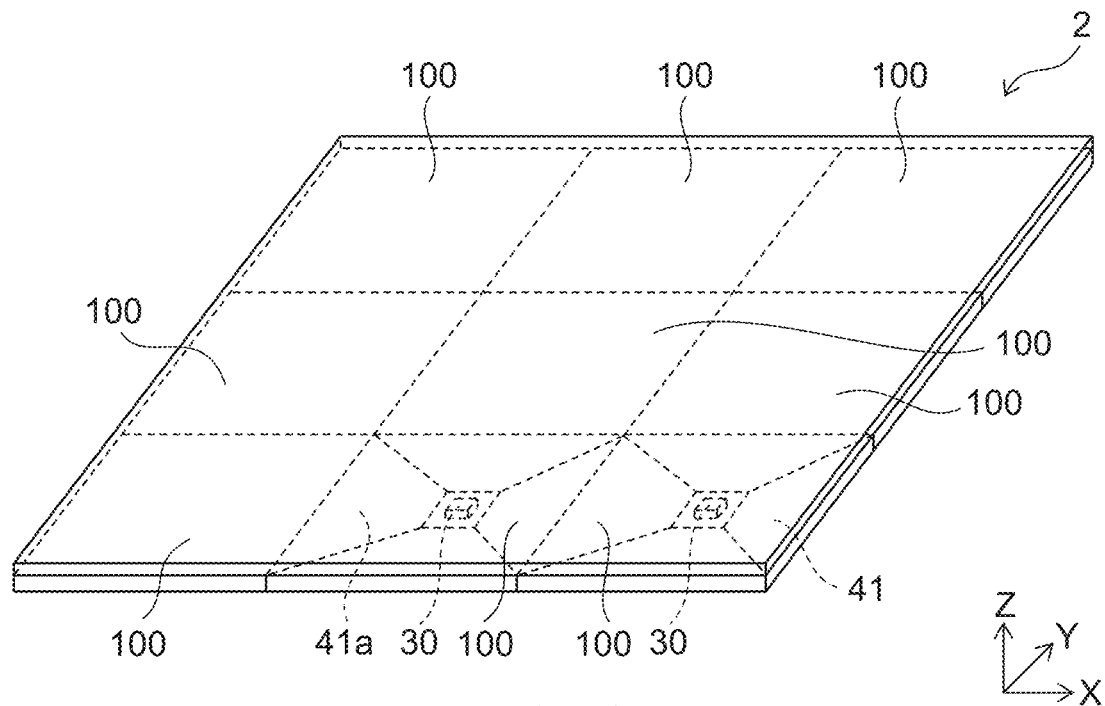
FIG. 3A is a perspective view showing an exemplary light-emitting device according to a second embodiment of the present disclosure.
Figure 3B:
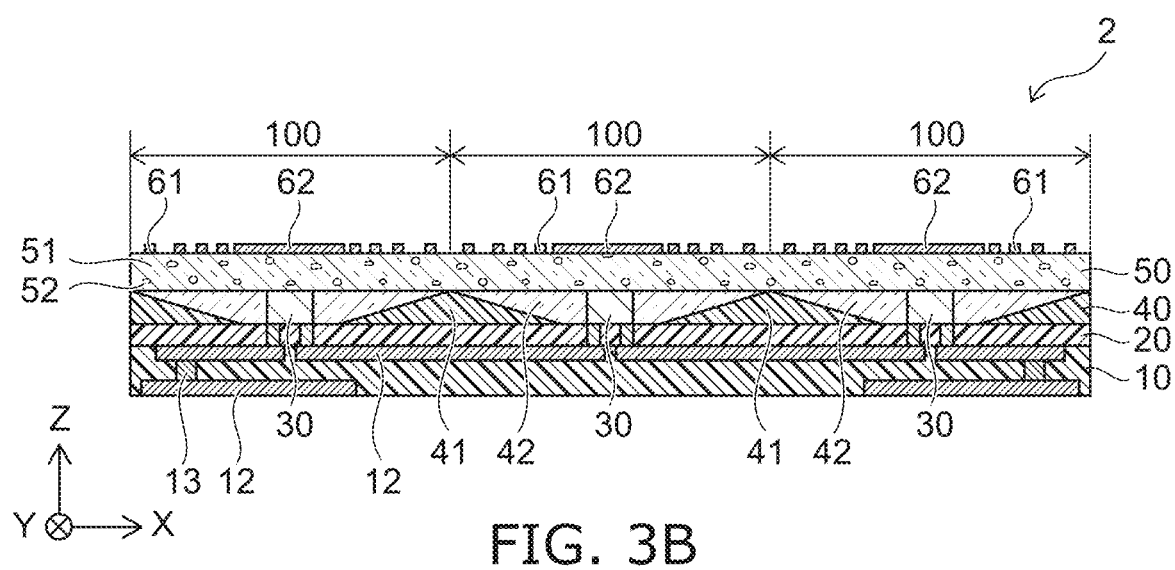
FIG. 3B is an end view showing the exemplary light-emitting device according to the second embodiment of the present disclosure.

In the light-emitting device 2 according to the embodiment as shown in FIGS. 3A and 3B, multiple units 100 are periodically arranged along the X-direction and the Y-direction. The configuration of each unit 100 is similar to the configuration of the light-emitting device 1 according to the first embodiment. The light-emitting element 30 is located in each unit 100. The wiring substrate 10, the reflective layer 20, the light guide member 40, and the diffuser plate 50 may be continuous between the adjacent units 100. The lengths in the X-direction and the Y-direction of each unit 100 are, for example, about 2 mm. The lengths in the X-direction and the Y-direction of the light-emitting element 30 are, for example, about 140 μm.

According to the embodiment, the size of the light-emitting device 2 can easily be increased by arranging the multiple units 100.

Third Embodiment

Figure 4:
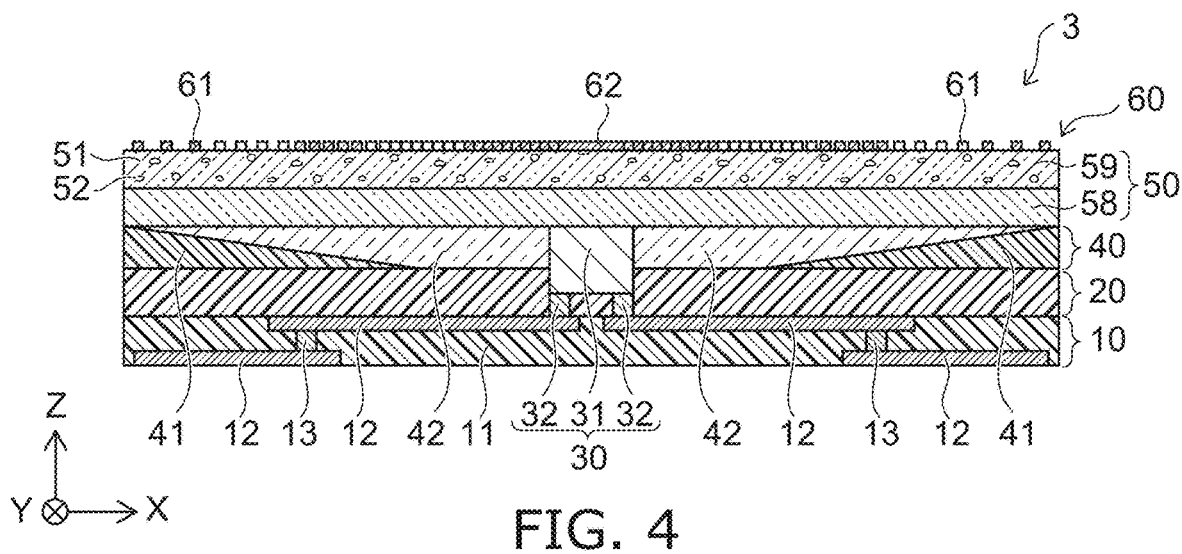
FIG. 4 is an end view showing an exemplary light-emitting device according to a third embodiment of the present disclosure.

As shown in FIG. 4, a light-emitting device 3 according to the embodiment differs from the light-emitting device 1 according to the first embodiment in that the diffuser plate 50 includes a first layer 58 and a second layer 59. The first layer 58 contacts the light-emitting element 30. The first layer 58 is formed of a light transmissive resin material and substantially does not include a phosphor. The second layer 59 is located on the first layer 58. The second layer is formed of the base material 51 configured as a light-transmitting material and the phosphor 52 included inside the base material 51. At least one of the first layer 58 or the second layer 59 may include a light-diffusing material.

According to the embodiment, because the diffuser plate 50 includes the first layer 58 that substantially does not include a phosphor, the light that is emitted from the light-emitting element 30 more easily propagates along the XY plane through the first layer 58. As a result, the uneven luminance is more easily reduced even when the upper surface 50a of the diffuser plate 50 is wide. Also, providing the second layer 59 that includes the phosphor 52 on the first layer 58 can achieve light of the desired color due to color mixing, and the light can be more diffused. Three or more layers may be stacked in the diffuser plate 50. The diffuser plate may further include a third layer located on the second layer. The third layer does not include a phosphor, or has a phosphor concentration less than a phosphor concentration of the second layer.

Because the diffuser plate 50 includes the first layer 58 that substantially does not include a phosphor, the heat that is emitted from the light-emitting element 30 is not easily released upward. However, according to the embodiment, the metal pattern 60 is located at the upper surface 50a of the diffuser plate 50, therefore, the upward heat dissipation can be compensated. Therefore, it is possible for the phosphor 52 to include a phosphor that is weak against heat such as a quantum dot phosphor, etc.

Fourth Embodiment

Figure 5:
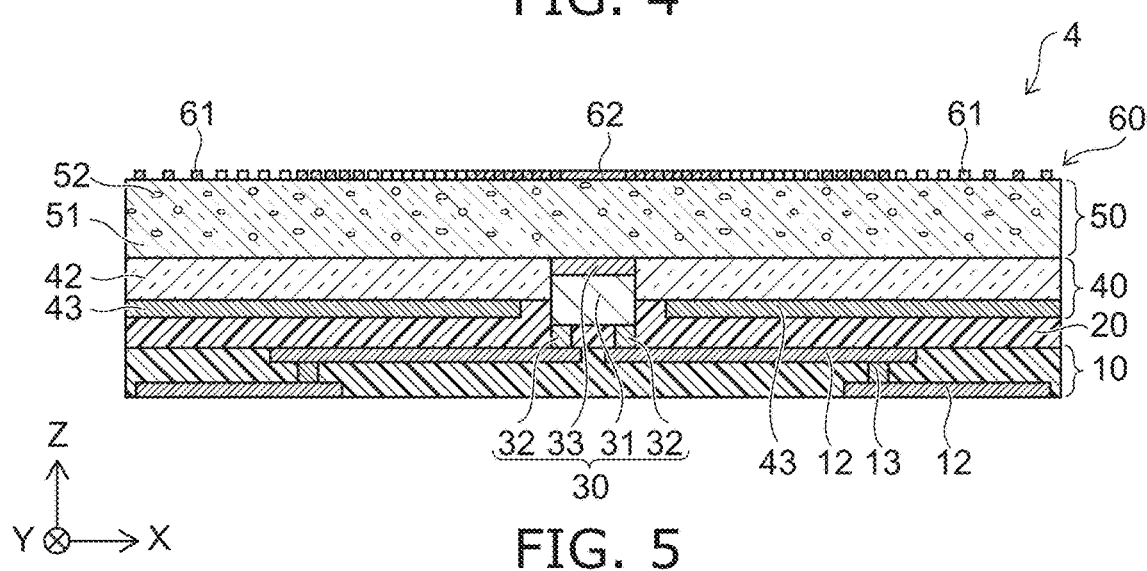
FIG. 5 is an end view showing an exemplary light-emitting device according to a fourth embodiment of the present disclosure.

As shown in FIG. 5, a light-emitting device 4 according to the embodiment differs from the light-emitting device 1 according to the first embodiment in that a light-shielding layer 33 is provided at the upper portion of the light-emitting element 30, the light guide member 40 does not include the reflecting portion 41, and the light guide member 40 includes a light-reflecting layer 43.

For example, the light-shielding layer 33 of the light-emitting element 30 can be formed of a metal material, a resin material that includes a light-reflective substance, an inorganic material that uses a dielectric multilayer film, etc., for example, the light-shielding layer 33 is formed of a metal and shields the light that is emitted upward from the semiconductor part 31. It is preferable for the metal material to have high light reflectance, for example, at least one of silver, aluminum, rhodium, gold, copper, and the like and an alloy of such metals are examples of the metal material. The light-reflective substance and the resin material can be selected from the materials illustrated as the white resin material included in the reflective layer 20 and/or the reflecting portion 41. The dielectric multilayer film includes, for example, titanium oxide, silicon oxide, zirconium oxide, potassium titanate, aluminum oxide, aluminum nitride, etc. Among these materials, metal materials are preferably used because the heat dissipation can be improved by allowing the metal materials to dissipate heat concentrated around the light-emitting element 30 to the region where the metal pattern 60 is formed.

For example, the light-reflecting layer 43 of the light guide member 40 is located below the light-emitting element 30 and is located between the reflective layer 20 and the light-transmitting portion 42. The light-reflecting layer 43 upwardly reflects or diffusely reflects the light that is emitted from the light-emitting element 30. The light-reflecting layer 43 may be formed of, for example, a metal and may be formed of, for example, a material that has high light reflectance such as aluminum, a silver alloy, etc. Or, a resin sheet (e.g., a resin foam sheet) that includes many bubbles, a resin sheet that includes a light-diffusing material, etc., can be used as the light-reflecting layer 43. For example, a thermoplastic resin such as an acrylic resin, a polycarbonate resin, a cyclic polyolefin resin, a polyethylene terephthalate resin, a polyester resin, or the like, a thermosetting resin such as an epoxy resin, a silicone resin, etc., are examples of the resin material used to form the light-reflecting layer 43. A known material such as titanium oxide, silica, alumina, zinc oxide, glass, etc., can be used as the light-diffusing material. Or, a specular reflective film or the like may be used as the light-reflecting layer 43.

In the light-emitting device 4 according to the embodiment, because the light-emitting element 30 includes the light-shielding layer 33, the light that is emitted directly above from the light-emitting element 30 can be reduced, and uneven luminance can be further reduced. Also, the light extraction efficiency can be increased because the light guide member 40 includes the light-reflecting layer 43.

Only either one of the light-shielding layer 33 or the light-reflecting layer 43 may be included. The second and third embodiments described above may be implemented in combination. For example, the diffuser plate 50 may include the first layer 58 and the second layer 59 as in the third embodiment while the light-shielding layer 33 may be provided in the light-emitting element 30 as in the fourth embodiment, and the light-reflecting layer 43 may be provided in the light guide member 40, or only either one of the light-shielding layer 33 or the light-reflecting layer 43 may be provided. For the third and fourth embodiments as well, multiple units may be arranged according to the second embodiment.

Fifth Embodiment

Figure 6:
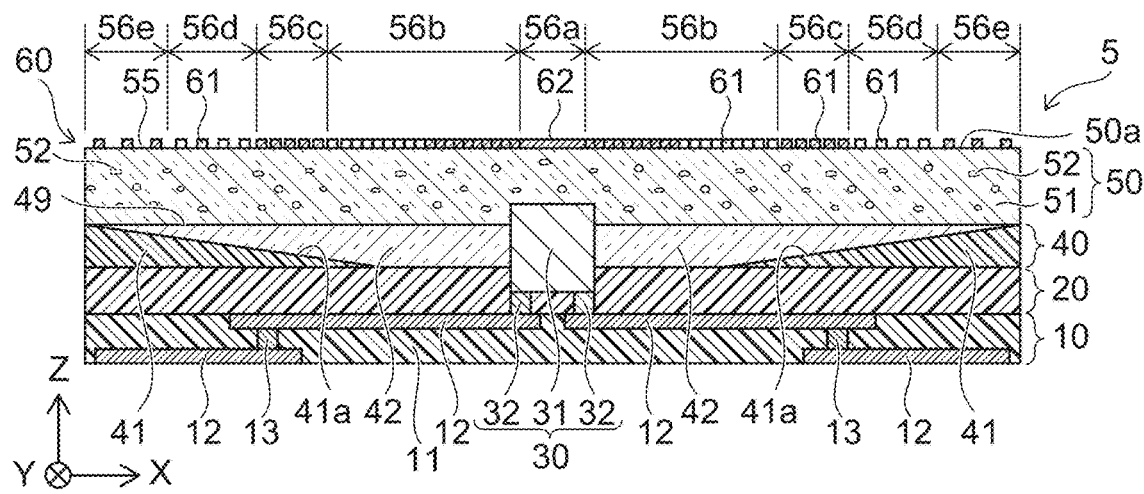
FIG. 6 is an end view showing an exemplary light-emitting device according to a fifth embodiment of the present disclosure.

As shown in FIG. 6, a light-emitting device 5 according to the embodiment differs from the light-emitting device 1 according to the first embodiment in that the upper portion of the semiconductor part 31 of the light-emitting element 30 is located inside the diffuser plate 50. In other words, the upper portion of the semiconductor part 31 is embedded inside the diffuser plate 50. Thereby, compared to the light-emitting device 1 according to the first embodiment, the light-emitting device 5 can be thinned further.

Sixth Embodiment

Figure 7:
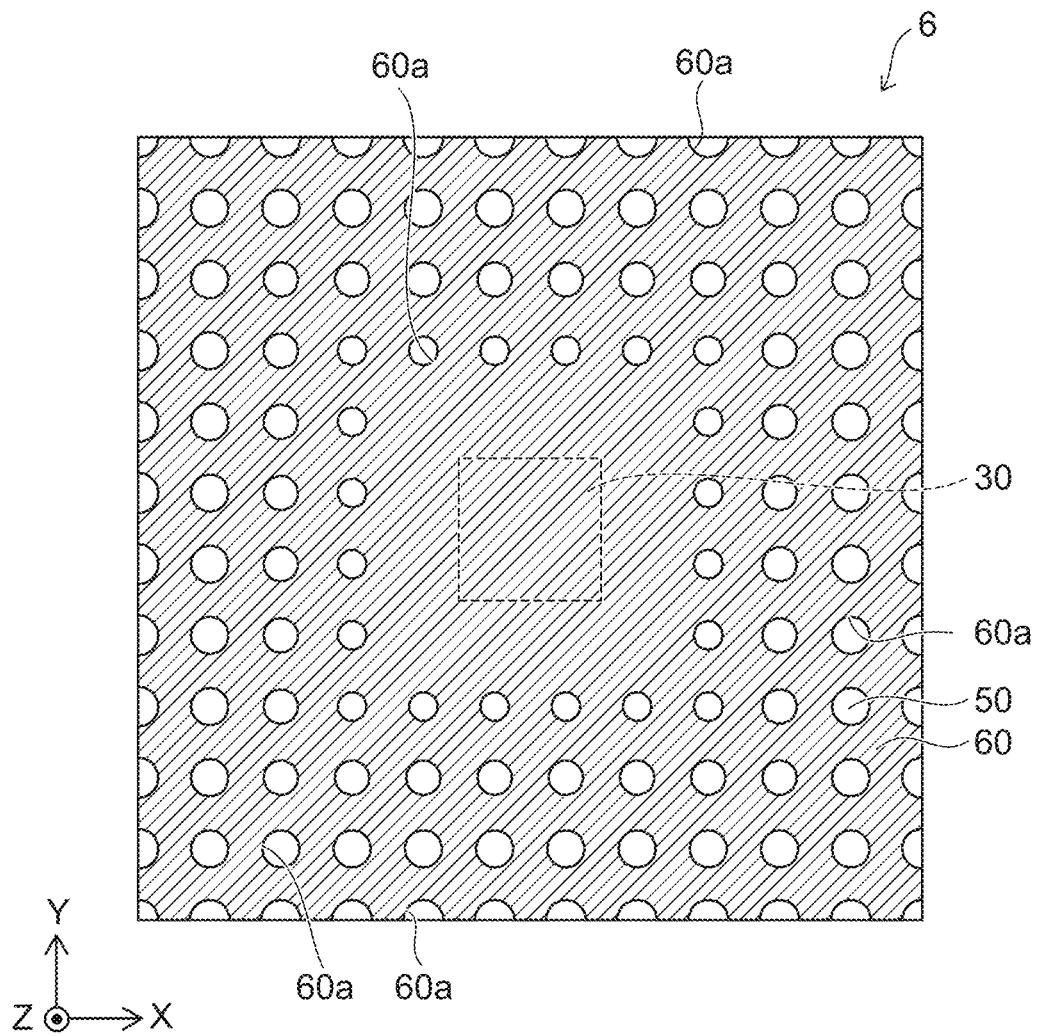
FIG. 7 is a top view showing an exemplary light-emitting device according to a sixth embodiment of the present disclosure.

In a light-emitting device 6 according to the embodiment as shown in FIG. 7, the metal pattern 60 is formed to have a continuous body. Multiple openings 60a are formed in the metal pattern 60. The openings 60a extend through the metal pattern 60 in the thickness direction. The multiple openings 60a are arranged along the X-direction and the Y-direction. The openings 60a become larger as the distance from the light-emitting element 30 increases. When multiple light-emitting devices are periodically arranged along the X-direction and the Y-direction as shown in FIGS. 3A and 3B, the metal pattern 60 of one light-emitting device 5 may be formed to have a continuous body with the metal pattern 60 of an adjacent light-emitting device 5. Therefore, the heat that flows into the metal pattern 60 is conducted over the multiple light-emitting devices 6. Thereby, for example, the heat generated in the light-emitting devices 6 that are lit is conducted to the metal patterns 60 of the light-emitting devices 6 that are unlit and is dissipated externally from such metal patterns 60. As a result, the heat dissipation of the light-emitting devices 6 is good.

It is unnecessary for the metal pattern 60 to cover the entire upper surface of the light-emitting device 6, and it is sufficient for the metal pattern 60 to be larger than the light-emitting element 30. In such a case as well, the heat dissipation can be improved by diffusing the heat that concentrates at the vicinity of the light-emitting element 30 to the region where the metal pattern 60 is formed.

Seventh Embodiment

Figure 8:
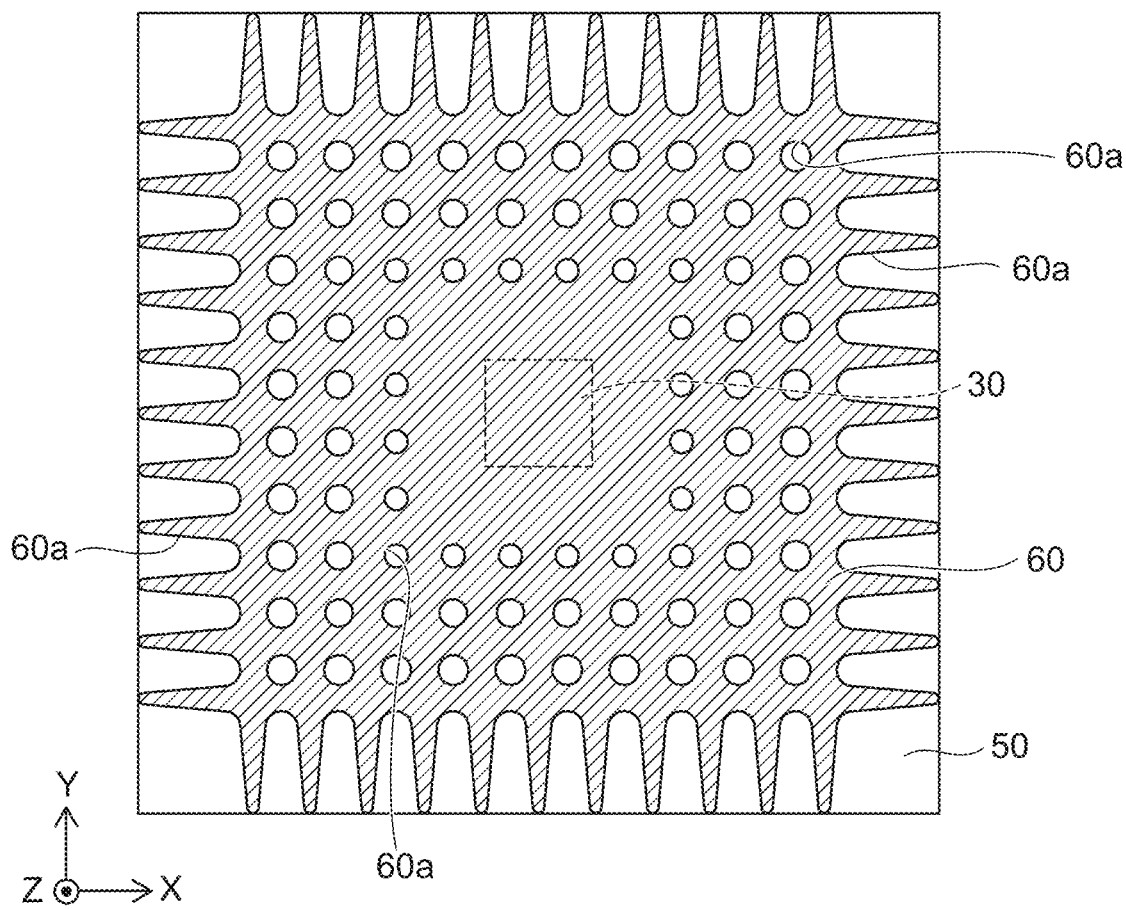
FIG. 8 is a top view showing an exemplary light-emitting device according to a seventh embodiment of the present disclosure.

As shown in FIG. 8, the light-emitting device according to the embodiment differs from the light-emitting device 6 according to the sixth embodiment in that the peripheral portion of the metal pattern 60 has a comb shape, and the openings 60a that are located at the peripheral portion include extension portions that extend toward the edge of the light-emitting device. The lengths of the extension portions in the elongating direction are greater than the maximum diameter of the other openings 60a, and preferably are not less than 2 times the maximum diameter. The luminance of the peripheral portion of the light-emitting device according to the embodiment can be increased thereby. Also, the heat dissipation is good because the heat can be diffused to the tip of the comb shape at the edge of the metal pattern 60.

Eighth Embodiment

Figure 9:
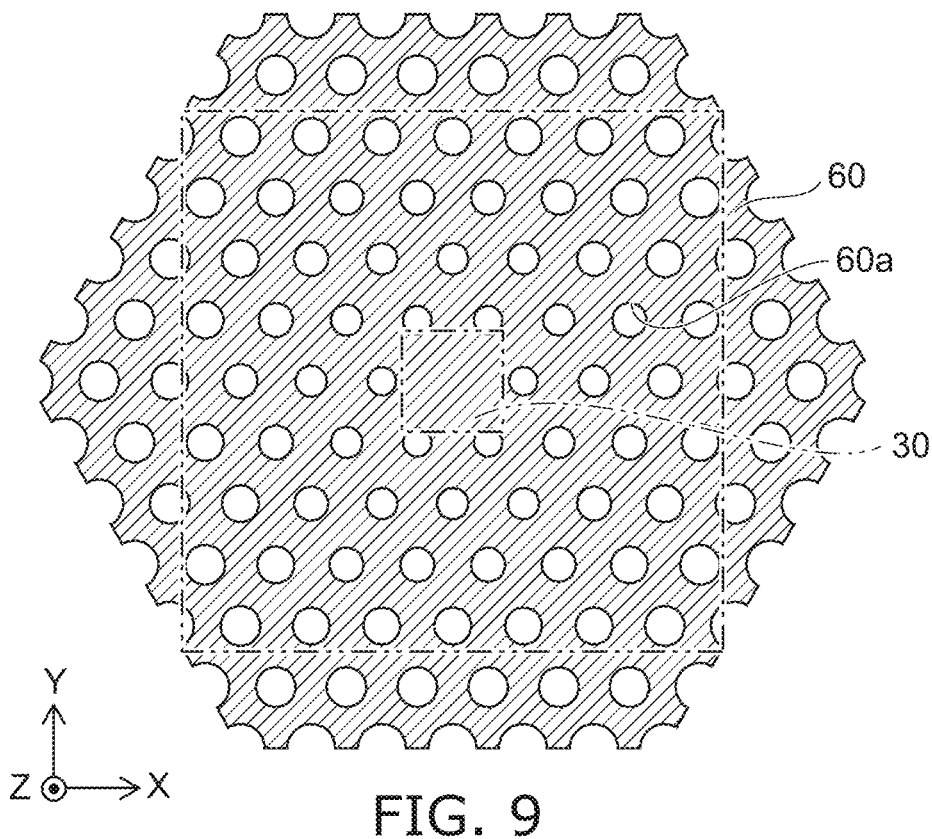
FIG. 9 is a top view showing an exemplary metal pattern according to an eighth embodiment of the present disclosure.

FIG. 9 is a top view schematically showing a metal pattern according to the embodiment.

In the light-emitting device according to the embodiment as shown in FIG. 9, for example, the openings 60a of the metal pattern 60 are arranged along three directions having 60° angles between each other. Uneven luminance is further reduced thereby. FIG. 9 shows the design concept of the metal pattern, the metal pattern 60 may be large or small compared to the size of the light-emitting device excluding the metal pattern in a top view. FIG. 9 shows the case where the metal pattern 60 is large compared to the light-emitting device. In such a case, a portion of the metal pattern that is outward of the light-emitting device may not exist.

Ninth Embodiment

Figure 10:
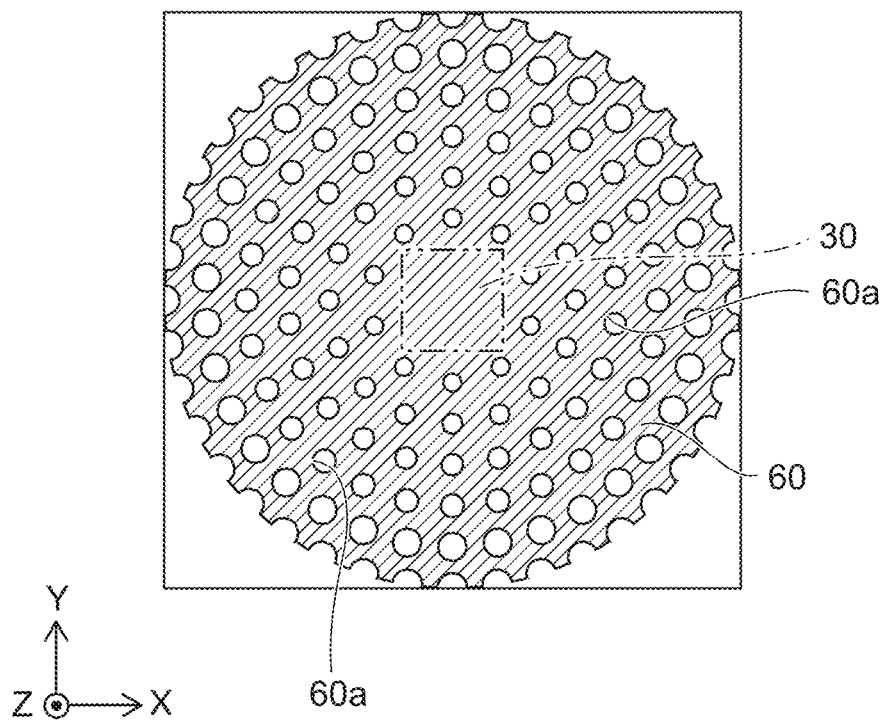
FIG. 10 is a top view showing an exemplary metal pattern according to a ninth embodiment of the present disclosure.

FIG. 10 is a top view schematically showing a metal pattern according to the embodiment.

In the light-emitting device according to the embodiment as shown in FIG. 10, the openings 60a of the metal pattern 60 are arranged in a concentric circular configuration. Uneven luminance is further reduced thereby. FIG. 10 shows the design concept of the metal pattern, the metal pattern 60 may be large or small compared to the size of the light-emitting device excluding the metal pattern in a top view. FIG. 10 shows the case where the metal pattern 60 is small compared to the light-emitting device. In such a case, the metal pattern exists only inside the light-emitting device in a top view.

Tenth Embodiment

Figure 11:
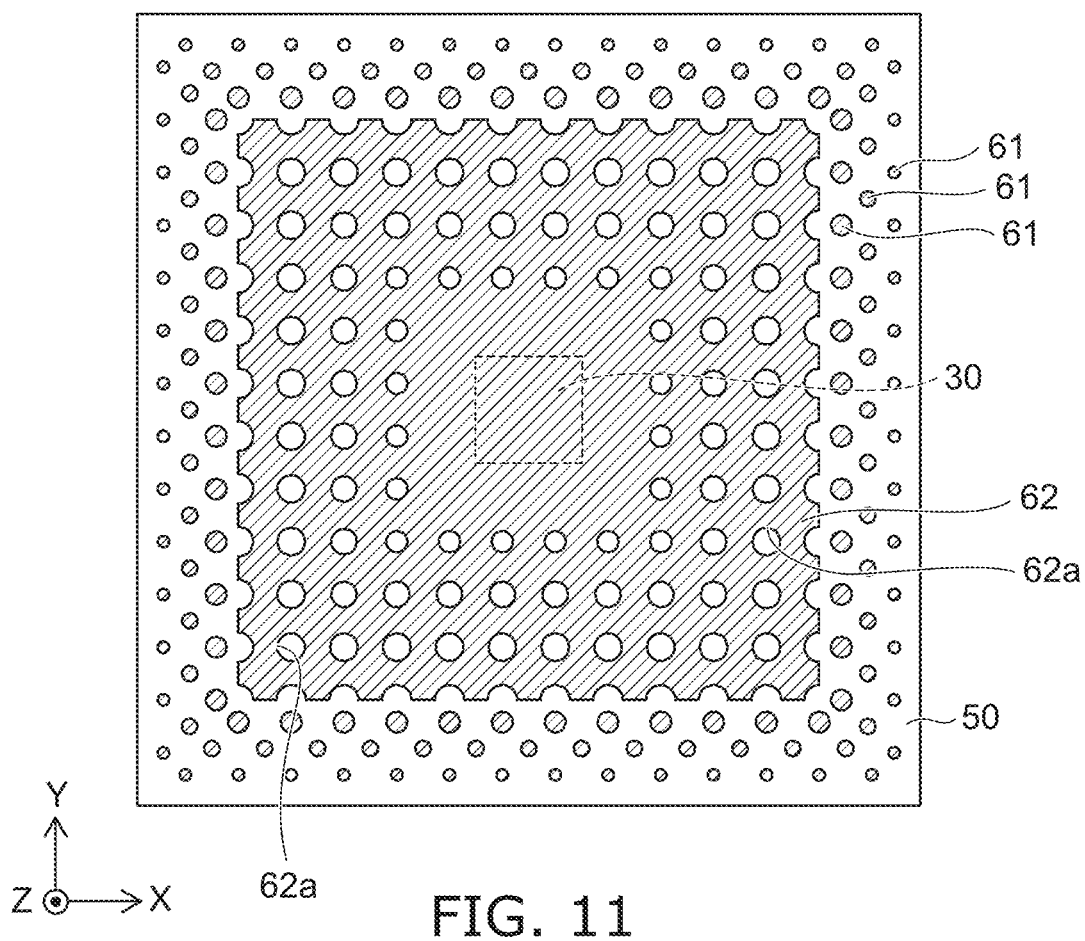
FIG. 11 is a top view showing an exemplary light-emitting device according to a tenth embodiment of the present disclosure.

In the light-emitting device according to the embodiment as shown in FIG. 11, the metal pattern 60 includes one second metal portion 62 and multiple mutually-separated first metal portions 61. Multiple openings 62a are formed in the second metal portion 62. When viewed from the Z-direction, the second metal portion 62 is located at the central portion of the light-emitting device, and the multiple first metal portions 61 are located at the peripheral portion of the light-emitting device. For example, the openings 62a of the second metal portion 62 are arranged along the X-direction and the Y-direction and become larger as the distance from the light-emitting element 30 increases. The first metal portions 61 become smaller as the distance from the light-emitting element 30 increases. Uneven luminance can be further reduced thereby. FIG. 11 shows the design concept of the metal pattern, the metal pattern 60 may be the same size as, larger, or smaller than the size of the light-emitting device excluding the metal pattern in a top view. FIG. 11 shows the case where the metal pattern 60 is the same size as the light-emitting device.

Eleventh Embodiment

Figure 12:
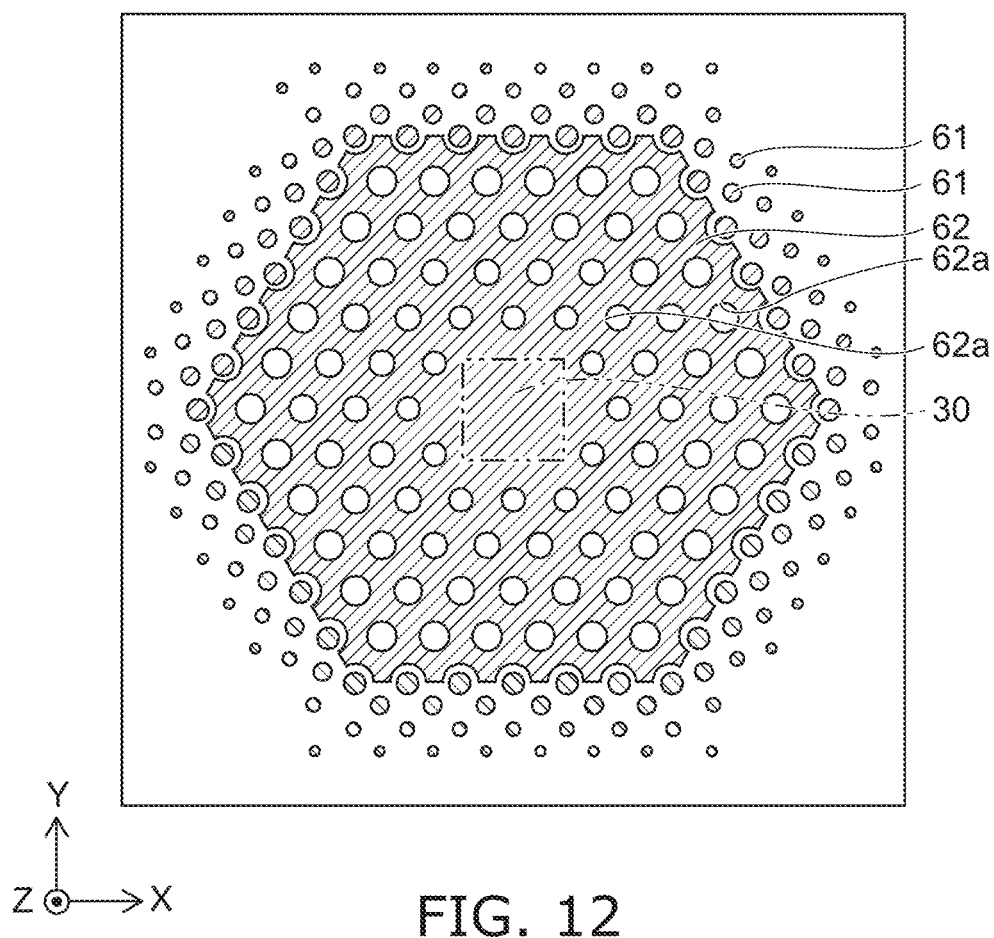
FIG. 12 is a top view showing an exemplary metal pattern according to an eleventh embodiment of the present disclosure.

FIG. 12 is a top view schematically showing a metal pattern according to the embodiment.

In the light-emitting device according to the embodiment as shown in FIG. 12, the multiple first metal portions 61 and the multiple openings 62a of the second metal portion 62 of the metal pattern 60 are arranged along three directions. FIG. 12 shows the design concept of the metal pattern, the metal pattern 60 may be large or small compared to the size of the light-emitting device excluding the metal pattern in a top view. FIG. 12 shows the case where the metal pattern 60 is small compared to the light-emitting device. In such a case, the metal pattern exists only inside the light-emitting device in a top view.

According to embodiments, a light-emitting device can have less uneven luminance and can be thinned.

Hereinabove, exemplary embodiments of the invention are described with reference to specific examples. However, the invention is not limited to these specific examples. For example, additions, deletions, or modifications of some of the components or processes according to embodiments described above also are included in the invention. For example, according to embodiments, the region of the upper surface of the diffuser plate where the metal pattern is located may be the same size as or larger or smaller than the light-emitting device. Embodiments described above can be implemented in combination with each other. For example, the metal patterns that are shown in embodiments are applicable to light-emitting devices according to other embodiments.

For example, the invention can be utilized in the light source of a lighting device or display device, etc.

What is claimed is:

1. A light-emitting device, comprising:
   a light-emitting element;
   a light guide member surrounding the light-emitting element;
   a diffuser plate located on the light-emitting element and on the light guide member, the diffuser plate contacting the light-emitting element and diffusing light emitted from the light-emitting element; and
   a metal pattern located at an upper surface of the diffuser plate,
   wherein a proportion of a region with no metal pattern on the upper surface of the diffuser plate increases as a distance from the light emitting element increases
   wherein the metal pattern includes a plurality of elongated extension portions extending in a direction away from the light-emitting element in a top view, wherein base portions of the elongated extension portions are connected to each other in the top view,
   wherein tips of the elongated extension portions are separated from each other in the top view and reach an outer edge of the diffuser plate in the top view,
   wherein the elongated extension portions include
   a plurality of first elongated extension portions extending in a first direction from the light-emitting element in the top view,
   a plurality of second elongated extension portions extending in a direction opposite to the first direction from the light-emitting element in the top view,
   a plurality of third elongated extension portions extending in a second direction perpendicular to the first direction from the light-emitting element in the top view, and
   a plurality of fourth elongated extension portions extending in a direction opposite to the second direction from the light-emitting element in the top view,
   wherein each of the plurality of first elongated extension portions and the plurality of second elongated extension portions has a length in the second direction that becomes shorter as a distance from the light-emitting element becomes longer,
   wherein each of the plurality of third elongated extension portions and the plurality of fourth elongated extension portions has a length in the first direction that becomes shorter as a distance from the light-emitting element becomes longer, and
   wherein the metal pattern is located above the light-emitting element.

2. The light-emitting device according to claim 1, wherein the upper surface of the diffuser plate has:
   a first region located directly above the light-emitting element, and
   a second region surrounding the first region, and
   a proportion of a region with no metal pattern on the upper surface in the first region is less than a proportion of a region with no metal pattern on the upper surface in the second region.

3. The light-emitting device according to claim 2, wherein the proportion of the region with no metal pattern on the upper surface in the first region is 0%.

4. The light-emitting device according to claim 1, wherein the metal pattern includes a plurality of first metal portions that are separated from each other.

5. The light-emitting device according to claim 4, wherein one or more of the first metal portions have discal shapes.

6. The light-emitting device according to claim 1, wherein the metal pattern is formed as a continuous body, and has a plurality of openings.

7. The light-emitting device according to claim 1, wherein the metal pattern includes:
   a plurality of first metal portions that are separated from each other; and
   one second metal portion having a plurality of openings.

8. The light-emitting device according to claim 1, wherein the metal pattern includes at least one type of material selected from the group consisting of aluminum, copper, silver, and a silver alloy.

9. The light-emitting device according to claim 1, wherein the diffuser plate includes a phosphor.

10. The light-emitting device according to claim 1, wherein
    the diffuser plate includes:
    a first layer that contacts the light-emitting element and does not substantially include a phosphor; and
    a second layer that is located on the first layer and includes a phosphor.

11. The light-emitting device according to claim 10, wherein
    the diffuser plate further includes a third layer located on the second layer, and the third layer does not substantially include a phosphor, or has a phosphor concentration less than a phosphor concentration in the second layer.

12. The light-emitting device according to claim 1, wherein
a portion of the light-emitting element is located inside the diffuser plate.

13. The light-emitting device according to claim 12, wherein
the light-emitting element includes a light-shielding layer contacting the diffuser plate.

14. The light-emitting device according to claim 13, wherein
the light guide member includes:
 a reflecting portion including an upper surface, the upper surface being inclined toward the diffuser plate as a distance from the light-emitting element increases; and
 a light-transmitting portion that is located on the reflecting portion and contacts a lateral surface of the light-emitting element.

15. The light-emitting device according to claim 14, wherein
the light guide member includes a light-reflecting layer located below the light-emitting element.

16. The light-emitting device according to claim 12, wherein
the light guide member includes:
 a reflecting portion including an upper surface, the upper surface being inclined toward the diffuser plate as a distance from the light-emitting element increases; and
 a light-transmitting portion that is located on the reflecting portion and contacts a lateral surface of the light-emitting element.

17. The light-emitting device according to claim 1, wherein
the light-emitting element includes a light-shielding layer contacting the diffuser plate.

18. The light-emitting device according to claim 17, wherein
the light guide member includes:
 a reflecting portion including an upper surface, the upper surface being inclined toward the diffuser plate as a distance from the light-emitting element increases; and
 a light-transmitting portion that is located on the reflecting portion and contacts a lateral surface of the light-emitting element.

19. The light-emitting device according to claim 1, wherein
the light guide member includes:
 a reflecting portion including an upper surface, the upper surface being inclined toward the diffuser plate as a distance from the light-emitting element increases; and
 a light-transmitting portion that is located on the reflecting portion and contacts a lateral surface of the light-emitting element.

20. The light-emitting device according to claim 1, wherein
the light guide member includes a light-reflecting layer located below the light-emitting element.

* * * * *